United States Patent [19]

Hwang et al.

[11] Patent Number: 4,921,158

[45] Date of Patent: May 1, 1990

[54] BRAZING MATERIAL

[75] Inventors: Kuen-Shyang Hwang, Canoga Park, Calif.; Mohammad Sedigh, Merrick; Mark Roth, Freeport, both of N.Y.

[73] Assignee: General Instrument Corporation, New York, N.Y.

[21] Appl. No.: 314,808

[22] Filed: Feb. 24, 1989

[51] Int. Cl.$^5$ .................................................. B23K 1/04
[52] U.S. Cl. ............................... 228/124; 228/263.12; 428/620
[58] Field of Search ............... 228/121, 122, 124, 123, 228/263.12; 428/620

[56] References Cited

U.S. PATENT DOCUMENTS 3,650,826  3/1972  Ganser ................................. 428/620
4,602,731  7/1986  Dockus ............................ 228/124 X

OTHER PUBLICATIONS

Dalal et al "Ti-Cr-Al/Cu Interconnection Metallurgy . . .", from *IBM Technical Disclosure Bulletin*, vol. 26, No. 8, Jan. 1984, p. 4003.

Primary Examiner—Kenneth J. Ramsey
Attorney, Agent, or Firm—James & Franklin

[57] ABSTRACT

A mechanical and electrical bond between a silicon semiconductor wafer and a molybdenum contact is created by a multi-layer brazing material. The material includes adjacent layers of titanium and silver along with a layer which is either composed of aluminum or an aluminum-silicon composite. The material is heated to a temperature above its melting point. The aluminum reacts first with the silver, thereby dissolving less of the silicon. This reduces spiking and lowers the contact resistance.

20 Claims, 3 Drawing Sheets

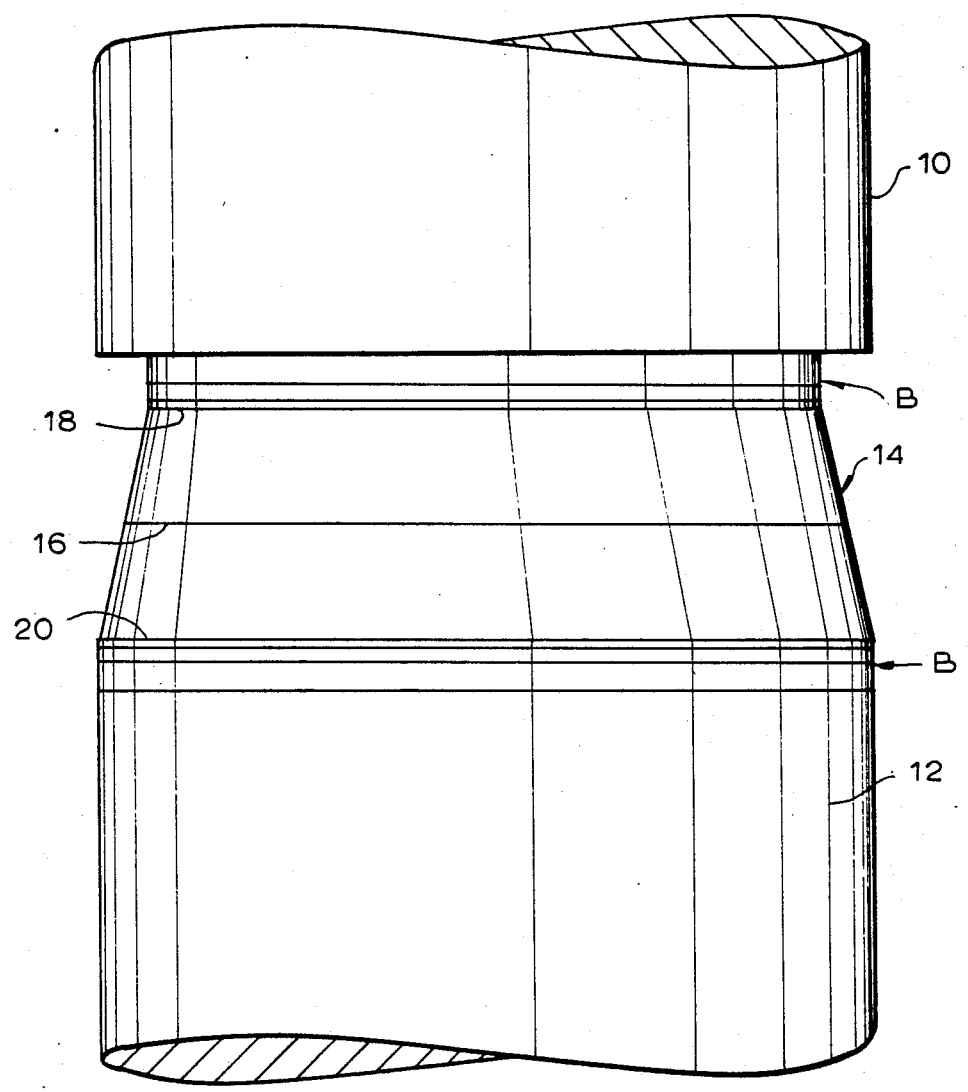
F I G. 1

BRAZING MATERIAL

The present invention relates to a material for making a mechanical and electrical bond between the surface of a semiconductor wafer and an adjacent metal component such as a contact or a heat sink composed of molybdenum or the like and, more specifically, to a multi-layer brazing material capable of forming a strong, low resistance joint.

The manufacture of semiconductor components such as for use as rectifiers and the like, requires that a semiconductor body, commonly made of a doped silicon, be mechanically and electrically joined to a metal component such as a contact or heat sink composed of molybdenum or the like. The connection requires a strong mechanical bond with low contact resistance. After brazing, the component is often completed by placing it in a glass enclosure or the like by well known packaging techniques.

Brazing techniques for joining semiconductor wafers to adjacent metal components have traditionally employed an aluminum layer interposed between the surfaces to be joined. The assembly is heated to a temperature greater than the melting point of aluminum. As the aluminum melts, it joins the surfaces of the wafer and the metal component. When a layer of aluminum is used as a brazing material, the thickness of the aluminum layer and the proper temperature are critical to a successful bond. The aluminum must be of sufficient thickness and the temperature must be accurately regulated.

However, even when appropriately performed, the prior art brazing process results in a high contact resistance for semiconductor wafers formed of N-type silicon because the aluminum layer in itself is a P-type dopent material. When the aluminum begins to melt, it melts first in localized areas which thereafter penetrate deeply to the body of the semiconductor wafer. This phenomenon is known as "spiking". Such spiking can ruin the device.

In order to solve this problem, the use of thinner aluminum layers has been considered. It was speculated that the use of a thinner aluminum layer would cut down the effect of the P-type dopent and hence the spiking. However, in practice, a thin aluminum layer cannot provide sufficient brazing material to make a strong mechanical bond.

In order to overcome the problems of spiking and high contact resistance and at the same time provide a joint of sufficient strength, we have invented an inexpensive multi-layer brazing material. This material results in a strong mechanical bond with a lower contact resistance. The deleterious effects of spiking have been substantially reduced in the multi-layer material by using additional metal layers in conjunction with the aluminum layer. These additional layers reduce the reaction of the aluminum with the silicon.

Our new invention includes a layer of titanium upon which a layer of silver is formed. These layers are used in conjunction with a third layer comprising aluminum or an aluminum-silicon composite. The third layer is interposed either between the wafer surface and the titanium layer or between the silver layer and the surface of the molybdenum component. The aluminum-silicon layer is preferably deposited on the semiconductor body in a homogeneous form by sputtering or in layers by depositing each metal in turn.

The layer of titanium is preferably put on the silicon or on the aluminum or aluminum-silicon composite before depositing the silver layer. This results in improved adhesion between the silver layer and the underlying layer. To achieve the desired results, the titanium layer is preferably quite thin, in a range from 200 to 1000 angstroms.

The component is heated until the brazing material melts. As the temperature rises, the aluminum (or aluminum composite) will react with the silver layer first (directly or in some cases through the thin layer of titanium) and form a eutectic. The aluminum-silver interface has a lower eutectic point than the aluminum-silicon interface. Although some of the silicon will dissolve, much less of the silicon will dissolve than in the case of the use of a singe layer of aluminum alone. Hence, less spiking occurs. Since most of the aluminum is tied up with the silver, less aluminum is available to react with the silicon. The P-type dopent effect normally caused by the aluminum is thus greatly reduced. The contact resistance is accordingly much lower.

Prior art attempts at obtaining similar results have employed different metal structures. For example, U.S. Pat. No. 3,253,951 to Marinaccio teaches a method of making low resistance contact to a silicon semiconductor device in which an untinnable surface is produced by vapor deposition of an aluminum layer over only a selected portion of the semiconductor. Thereafter, a titanium-silver alloy layer is formed over the entire semiconductor surface. The unit is then heated to approximately 615 degrees centigrade for about five minutes. The aluminum layer is approximately 8000 angstroms thick.

The present invention differs from that disclosed by Marinaccio in that all of the layers are coextensive and hence the layers react with the silicon surface uniformly. Moreover, in our invention separate titanium and silver layers are used instead of a single layer of titanium-silver alloy. In addition, the layer thicknesses are quite different and in particular, in our invention, the aluminum or aluminum-silicon composite layer is considerably thicker, preferably between 30,000 and 60,000 angstroms thick. Further, in our invention, we use a higher brazing temperature (600–800 degrees C.) such that the material actually melts during the brazing operation. The structure disclosed in the Marinaccio patent intentionally provides a surface which does not wet to solders and the metal itself does not melt in the tinning operation.

U.S. Pat. No. 3,549,437 to Stepberger relates to a method of producing metal structures on semiconductor surfaces. It teaches a metal layer which, when processed by a photo varnish, can be etched uniformly without undercut phenomena. Hence, the material involved is not used for brazing. The structure includes a layer of aluminum which is either pure or has been supplemented with another metal, such as 1% gold, silver, nickel, iron or cobalt. This structure differs from our structure in the thickness of the metal layer, the type of metals used and the sequence of metal deposition.

U.S. Pat. No. 3,650,826 to Ganzer relates to a method for producing metal contacts for mounting semiconductor components in housings. This patent teaches the use of an aluminum-nickel alloy about 5000 angstroms thick on the silicon. Upon the alloy layer is created a layer of titanium also 5000 angstroms thick and a layer of silver 10000 angstroms thick. This differs from the present invention with respect to the thickness, the metal type and the sequence of metal deposition.

U.S. Pat. No. 4,500,904 to Onuki relates to a solder joint for use between a semiconductor substrate and an electrode. The N-type semiconductor layer is provided with an aluminum or aluminum alloy layer of 200,000 angstroms thickness. The electrode side is provided with a copper (K-S.H.) layer of 100,000 angstroms thickness. An optional nickel film may be provided between the copper (K-S.H.) solder and the electrode surface. Bonding is a result mainly of solid state diffusion. The material is only heated to about 450 degrees C, a temperature lower than the eutectic point. Our invention differs from that disclosed by Onuki because of the types of metals used, the sequence of metals, the thickness of the layers and the bonding temperatures employed.

It is, therefore, a prime object of the present invention to provide a brazing material for forming a strong mechanical bond between the surface of a semiconductor wafer and the surface of a metal component.

It is another object of the present invention to provide a brazing material capable of forming a bond in which low contact resistance is achieved.

It is another object of the present invention to provide a brazing material in which layers of silver and titanium are employed.

It is another object of the present invention to provide a brazing material for forming a bond in which the deleterious effects of spiking are substantially reduced.

It is another object of the present invention to provide a brazing material for forming a bond in which the P-type dopent effect of the traditional aluminum layer is substantially reduced.

It is another object of the present invention to provide a brazing material which includes a titanium layer with a layer of silver deposited thereon.

It is another object of the present invention to provide a brazing material which includes a layer of aluminum or aluminum-silicon composite interposed either between the semiconductor surface and the titanium layer or between the silver layer and the surface of the metal component.

In accordance with one aspect of the invention, a brazing material is provided for forming a mechanical and electrical bond between the surface of a silicon semiconductor wafer and a metal component composed of molybdenum or the like. The material includes a layer of titanium and a layer of silver formed adjacent the layer of titanium. A third layer comprising aluminum is also employed.

The third layer may comprise substantially pure aluminum or an aluminum-silicon composite. The composite preferably is approximately 11% silicon, by weight.

In one preferred embodiment, the third layer is interposed between the semiconductor surface and the titanium layer. In a second preferred embodiment, the third layer is interposed between the layer of silver and the surface of the metal component.

The layer of titanium preferably has a thickness in the range of 200 to 1000 angstroms. Most preferably, the thickness of the titanium layer is approximately 500 angstroms.

The layer of silver preferably has a thickness in the range of 3000 to 20,000 angstroms. The third layer preferably has a thickness in the range of 30,000 to 60,000 angstroms.

Preferably the layers are substantially coextensive. Hence, each of the layers substantially covers the entire layer beneath it.

In accordance with another aspect of the present invention, a method is provided for forming a mechanical and electrical bond between the surface of a silicon semiconductor and a metal component. The method comprises the steps of forming a multi-layer brazing material between the semiconductor surface and the surface of the metal component, and heating the material to a temperature above the melting point thereof. The material is formed by first forming the layer of titanium. The layer of silver is then formed adjacent the layer of titanium. A third layer, comprising aluminum, is also formed.

The third layer is formed on the surface of the semiconductor or on the surface of the silver layer. It may be comprised of substantially pure aluminum or an aluminum-silicon composite. The composite is preferably 11% silicon by weight.

The material is heated in the range of 600 to 800 degrees C., preferably to 740 degrees C. Hence, the material is heated to a temperature above its melting point.

To these and such other objects which may hereinafter appear, the present invention relates to a brazing material for forming a bond between a semiconductor wafer and a metal component, as set forth in detail in the following specification and recited in the annexed claims, taken together with the accompanying drawings, in which like numerals refer to like parts and in which:

FIG. 1 is an enlarged side view of a typical rectifier formed by sandwiching a silicon semiconductor wafer between a pair of molybdenum contacts.

Figure 2:
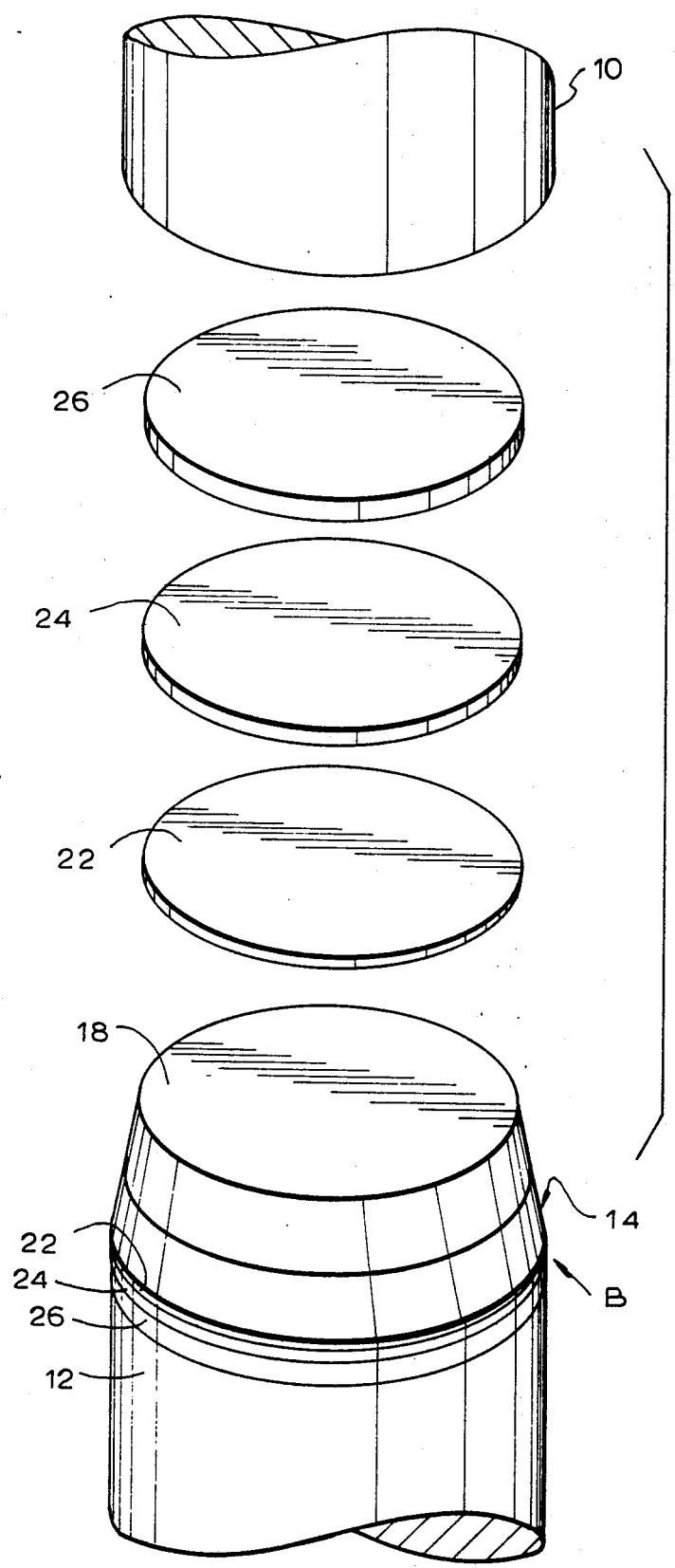
FIG. 2 is an exploded isometric view of a first preferred embodiment of the brazing material of the present invention.

FIG. 1 shows a greatly enlarged side view of an idealized rectifier prior to encapsulation. In practice, the rectifier may be a glass sleeve rectifier or an axial leaded GPR rectifier or any similar component. It should be understood, however, that the nature of the particular semiconductor component being bonded plays no part in the present invention and the present invention should not be construed as limited to any or with any particular semiconductor structure.

For purposes of explanation, the idealized rectifier in FIG. 1 includes first and second heat sinks, 10 and 12, composed of a metal such as molybdenum between which is sandwiched a silicon semiconductor wafer 14, illustrated to show a P-N junction 16. The upper surface 18 of wafer 14 and the lower surface 20 of wafer 14 are respectively bonded to the surfaces of components 10, 12 by the multi-layer brazing material of the present invention, generally designated B, in order to form a strong mechanical joint with low resistance.

FIG. 1 shows the brazing material in its first preferred form. The composition of the material is illustrated in detail in FIG. 2 which includes an exploded isometric of the layers.

Figure 3:
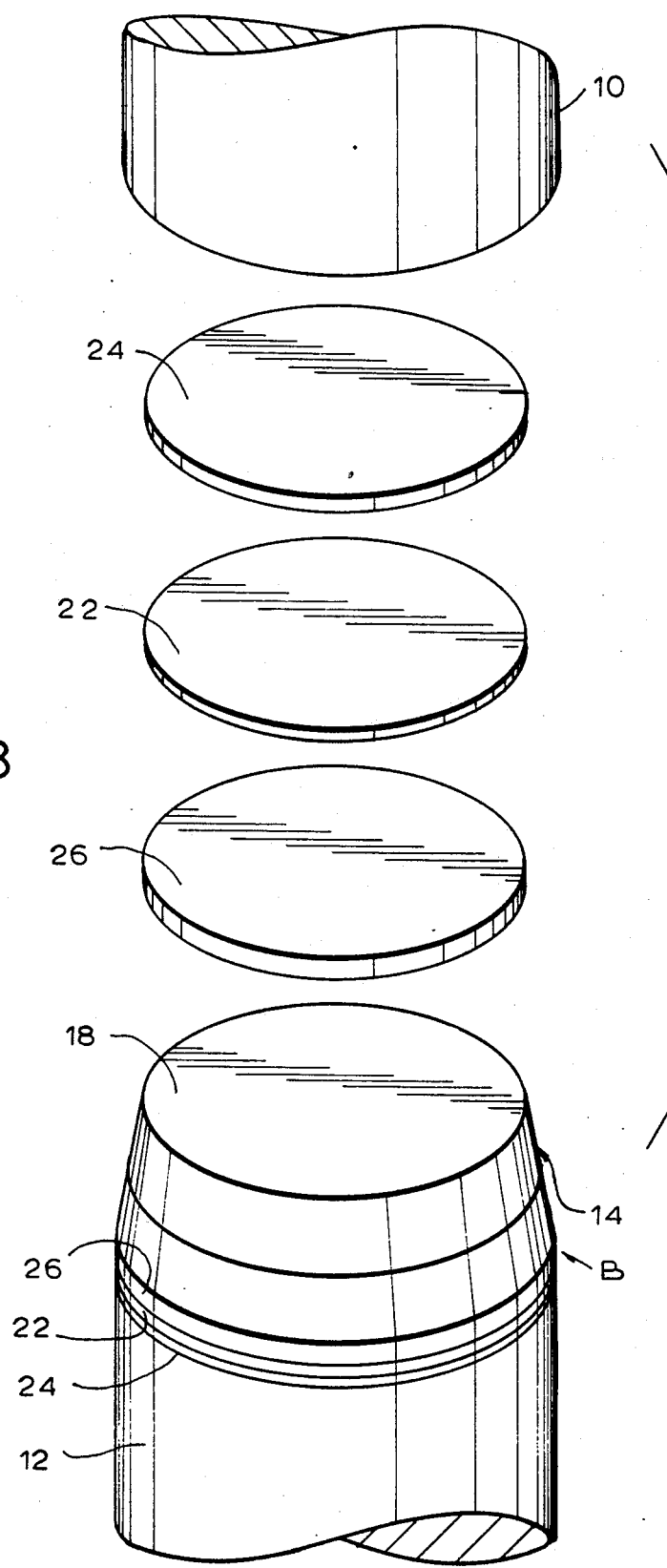
FIG. 3 is an exploded isometric view of a second preferred embodiment of the brazing material of the present invention.

Both embodiments of the present invention include a titanium layer 22, a silver layer 24 and a layer 26 of substantially pure aluminum or an aluminum composite. The only difference between the embodiments is the order in which the layers are used. In the first preferred embodiment, as illustrated in FIG. 2, the titanium layer 22 and silver layer 24 are situated adjacent the surface 18 of layer 14. Layer 26 is interposed between the silver layer 24 and the surface of the contact. In the second preferred embodiment, illustrated in FIG. 3, the titanium and silver layers 22 (K-S.H.) and 24 are adjacent the surface of the contact with layer 26 between them and the surface of the wafer.

The thickness of titanium layer 22 is preferably quite thin, within the range of 200 to 1,000 angstroms. The most preferable thickness appears to be approximately 500 angstroms.

Adjacent the titanium layer 22 is formed the silver layer 24. Silver layer 24 is considerably thicker than the titanium layer 22, preferably in the range of from 3,000 to 20,000 angstroms thick.

In the first embodiment, layer 26 is formed on silver layer 24. Layer 26 can be formed of substantially pure aluminum or an aluminum silicon composite may be utilized. When the composite is utilized, it is preferable to form the composite with approximately 11% silicon by weight. The thickness of layer 26 is preferably in the range of between 30,000 and 60,000 angstroms. In this embodiment, the surface of layer 26 is adjacent to the surface of the metal contact member.

In the second preferred embodiment, the third layer 26 is situated between the surface 18 of the semiconductor wafer 14 and the titanium layer 22. Silver layer 24 is adjacent to the surface of the metal contact.

The metals can be deposited on the wafer in a homogeneous form by sputtering or in layers formed by depositing each metal in sequence. Each layer is substantially coextensive with the other layers and the surface of the wafer and contact to be joined during the brazing process.

The multilayer brazing material is heated to a temperature where the material actually melts. Preferably, the temperature range is from 600 to 800 degrees C, with the most preferable temperature being about 740 degrees. As the temperature rises, it appears that the aluminum in layer 26 will react with the silver layer 24 first to form a eutectic. This is because aluminum and silver have a lower eutectic point than aluminum and silicon. The aluminum-silver eutectic will dissolve some of the silicon, but less than is the case where the traditional layer of pure aluminum is used alone. Consequently, less spiking occurs. Since most of the aluminum is tied up with the silver, less aluminum can react with the silicon. Hence the P-type dopent effect caused by the aluminum is greatly reduced and the contact resistance is therefore lower.

The brazed structure can be further processed to complete the rectifier by well known packaging techniques, such as glass encapsulation. Such a device will have lower forward voltage when compared to devices prepared with conventional brazing materials.

It should now be appreciated that the present invention relates to a multilayer brazing material which results in a strong mechanical bond with lower electrical resistance. The brazing material is composed of a layer of titanium, a layer of silver and a layer of substantially pure aluminum or an aluminum composite. The material is heated to a temperature which exceeds the melting point of the material. Because the aluminum and silver have a lower eutectic point than the aluminum and silicon, the aluminum and silver eutectic will dissolve less silicon than in the conventional process, leading to less spiking and hence lower contact resistance.

While only two preferred embodiments of the present invention have been disclosed for purposes of illustration, it is obvious that many variations and modifications could be made thereto. It is intended to cover all of these variations and modifications which fall within the scope of the present invention as defined by the following claims.

We claim:

1. An assembly for brazing a silicon semiconductor body and a metal component, said assembly including brazing material comprising a layer of titanium, a layer of silver formed adjacent said layer of titanium and a layer comprising an aluminum-silicon composite.

2. The assembly of claim 1 wherein said composite is approximately 11% silicon by weight.

3. The assembly of claim 1 wherein said aluminum-silicon composite layer is interposed between the surface of the semiconductor body and said titanium and silver layers.

4. The assembly of claim 1 wherein said layer of titanium has a thickness in the range of 200 to 1,000 angstroms.

5. The assembly of claim 1 wherein said layer of silver has a thickness in the range of 3,000 to 20,000 angstroms.

6. The assembly of claim 1 wherein said layers are all substantially coextensive.

7. An assembly for brazing a silicon semiconductor body and a metal component, said assembly including brazing material comprising a layer of titanium, a layer of silver formed adjacent said layer of titanium and a third layer comprising aluminum, said third layer being interposed between said layers of titanium and silver and the surface of the metal component.

8. An assembly for brazing a silicon semiconductor body and a metal component, said assembly including brazing material comprising a layer of titanium, a layer of silver formed adjacent said layer of titanium and a third layer comprising aluminum, said layer of titanium having a thickness of approximately 500 angstroms.

9. An assembly for brazing a silicon semiconductor body and a metal component, said assembly including brazing material comprising a layer of titanium, a layer of silver formed adjacent said layer of titanium and a third layer comprising aluminum having a thickness in the range of 30,000–60,000 angstroms.

10. A method for forming a mechanical and electrical bond between the surface of a silicon semiconductor body and a metal component, the method comprising the steps of: forming a layer of titanium, forming a layer of silver adjacent the layer of titaniumm forming a layer composed of an aluminum-silicon composite and thereafter heating the assembly to a temperature above the melting point of the formed layers.

11. A method for forming a mechanical and electrical bond between the surface of a silicon semiconductor body and a metal component, the method comprising the steps of: depositing a multi-layer of brazing material between the semiconductor surface and the metal component and heating the metal to a temperature above its melting point, the material being deposited by forming a layer of titanium, forming a layer of silver adjacent the layer of titanium and forming a third layer comprising aluminum, said third layer being formed between the layers of titanium and silver and the surface of the component.

12. A method for forming a mechanical and electrical bond between the surface of a silicon semiconductor body and a metal component, the method comprising the steps of: forming a layer of titanium of a thickness of approximately 500 angstroms, forming a layer of silver adjacent the layer of titanium and forming a third layer composed of aluminum.

13. A method for forming a mechanical and electrical bond between the surface of the silicon semiductor body and a metal component, the method comprising the steps of: forming a layer of titanium, forming a layer of silver adjacent the layer of titanium and forming a third layer composed of aluminum having a thickness in the range of 30,000 to 60,000 angstroms.

14. The method of claim 10 wherein said aluminum-silicon composite layer is formed between the surface of the semiconductor body and the titanium and silver layers.

15. The method of claim 10 wherein the composite is 11% silicon by weight.

16. The method of claim 10 wherein the material is heated in a range of 600 to 800 degrees C.

17. The method of claim 10 wherein the material is heated to approximately 740 degrees C.

18. The method of claim 10 wherein said layer of titanium has a thickness in the range of 200 to 1000 angstroms.

19. The method of claim 10 wherein said layer of silver has a thickness in the range of 3,000 to 20,000 angstroms.

20. The method of claim 10 wherein said layers are all substantially coextensive.

* * * * *